United States Patent
Cho

Patent Number: 5,619,064
Date of Patent: Apr. 8, 1997

[54] III-V SEMICONDUCTOR GATE STRUCTURE AND METHOD OF MANUFACTURE

[75] Inventor: Jaeshin Cho, Gilbert, Ariz.

[73] Assignee: Motorola, Inc., Schaumburg, Ill.

[21] Appl. No.: 587,045

[22] Filed: Jan. 16, 1996

Related U.S. Application Data

[62] Division of Ser. No. 254,206, Jun. 6, 1994, Pat. No. 5,484,740.

[51] Int. Cl.⁶ .................................................. H01L 23/58
[52] U.S. Cl. ......................... 257/637; 257/640; 257/649; 257/280
[58] Field of Search ................................. 257/280, 281, 257/640, 637, 473, 649

[56] References Cited

U.S. PATENT DOCUMENTS 4,599,790   7/1986   Kim et al. .......................... 257/280
4,757,033   7/1988   Ebata .................................. 257/280

*Primary Examiner*—Jerome Jackson
*Assistant Examiner*—Nathan K. Kelley
*Attorney, Agent, or Firm*—Miriam Jackson

[57] ABSTRACT

A manufacturable III-V semiconductor gate structure having small geometries is fabricated. A silicon nitride layer is formed on a III-V semiconductor material and a dielectric layer comprised of aluminum is formed on the silicon nitride layer. Another dielectric layer comprised of silicon and oxygen is formed over the dielectric layer comprised of aluminum. The dielectric layer comprised of aluminum acts as an etch stop for the etching of the dielectric layer comprised of silicon and oxygen with a high power reactive ion etch. The dielectric layer comprised of aluminum may then be etched with a wet etchant which does not substantially etch the silicon nitride layer. Damage to the surface of the semiconductor material by exposure to the high power reactive ion etch is prevented by forming the dielectric layer comprised of aluminum between the silicon nitride layer and the dielectric layer comprised of silicon and oxygen.

5 Claims, 4 Drawing Sheets

III-V SEMICONDUCTOR GATE STRUCTURE AND METHOD OF MANUFACTURE

This is a division of application Ser. No. 08/254,206, filed Jun. 6, 1994, U.S. Pat. No. 5,484,740.

BACKGROUND OF THE INVENTION

This invention relates to, in general, a III-V semiconductor device, and more particularly, but not limited to, a method of forming a gate structure of a III-V semiconductor device.

A silicon nitride layer and a silicon dioxide layer overlying the silicon nitride layer are typically used to protect the surface of a gallium arsenide semiconductor material. A high power reactive ion etch is used to remove portions of the silicon dioxide layer. As device geometries have shrunk, it has been difficult to maintain a uniform etch of the silicon dioxide layer across a wafer without etching of the underlying silicon nitride layer. This difficulty results in reactive-ion etch induced damage to the gallium arsenide surface. This damage to the gallium arsenide surface results in poor device yield, poor electrical characteristics and performance of the semiconductor device.

Therefore, it would be desirable to have a manufacturable process which allows for the fabrication of gallium arsenide devices free of reactive ion etch induced damage.

DETAILED DESCRIPTION OF THE DRAWINGS

The present invention relates to a method of forming a gate structure of a semiconductor device. This method allows for the formation of a gate layer to have a rectifying contact to a III-V semiconductor material. This is enabled by using a dielectric layer comprised of aluminum as an etch stop layer in order to prevent exposure of the III-V semiconductor surface to a high power reactive ion etch (RIE) used to etch an overlying dielectric layer. Without the use of this dielectric layer comprised of aluminum, the surface of the III-V semiconductor material will be exposed to the high power RIE because of non-uniformities of the etch rate across a wafer. The high power RIE causes electrically active defects in the semiconductor material. As will be described below, this invention prevents the exposure of the surface of the semiconductor material to high power RIE, thus enabling the manufacture of III-V semiconductor devices having gate structures with small geometries.

Figure 1:
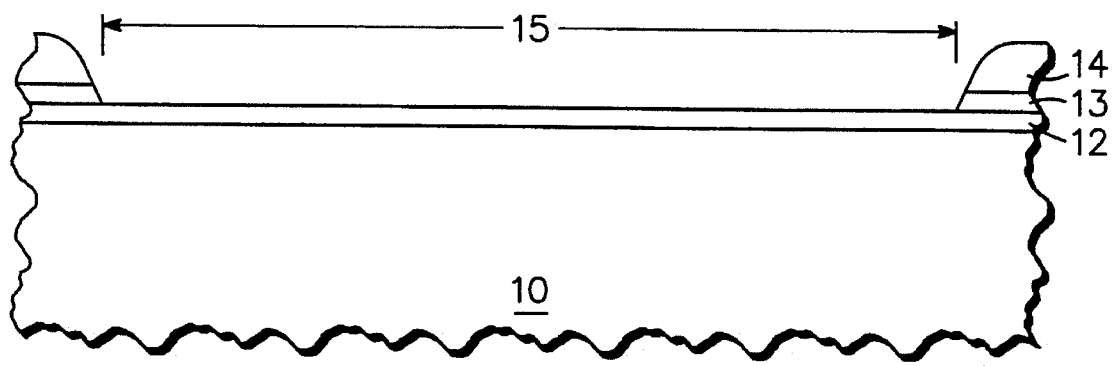
FIG. 1 illustrates an enlarged, cross-sectional view of a first embodiment of the present invention in a beginning stage of fabrication.

FIG. 1 illustrates a cross-sectional view of an embodiment of the present invention. What is shown is a semiconductor material 10 comprised of a III-V compound. Semiconductor material 10 is preferably comprised of gallium arsenide (GaAs). First, a silicon nitride layer 12 is formed on the surface of semiconductor material 10 to prevent outgassing of semiconductor material 10. Other dielectric layers which prevent outgassing may be used. Silicon nitride layer 12 can be formed using conventional means known in the art, and preferably has a thickness of approximately 100 to 1000 Angstroms in order to protect the surface of III-V semiconductor material 10 during subsequent processing.

Next, a dielectric layer 13 comprised of aluminum is formed over silicon nitride layer 12. If dielectric layer 13 is comprised of aluminum nitride, it is preferably formed by reactive sputtering of aluminum (Al) using argon (Ar) and nitrogen ($N_2$) gases. Other processes, such as metal-organic chemical vapor deposition may be used. The thickness of dielectric layer 13 is preferably approximately 100 to 1000 Angstroms. The lower limit is constrained by the desire to avoid pinhole formation associated with thinner layers, where dielectric layer 13 would lose its etch stop property, while the upper limit is constrained by the loss of dimensional control due to undercutting of dielectric layer 13. Preferably, the thickness of dielectric layer 13 ranges from about 300 to 500 Angstrom. Dielectric layer 13 acts as an etch stop layer, as will be further described below.

Because dielectric layer 13 caps silicon nitride layer 12, it is necessary to provide silicon nitride layer 12 free of hydrogen and moisture. Otherwise, dielectric layer 13 prevents the release of the hydrogen and moisture, which results in cracking of silicon nitride layer 12.

Then, a dielectric layer 14 comprised of silicon and oxygen is formed over dielectric layer 13. In a preferred embodiment, dielectric layer is comprised of silicon dioxide ($SiO_2$) because it is widely used in semiconductor manufacturing, but a silicon oxynitride ($SiO_xN_y$), for example, may also be used. Dielectric layer 14 may be formed using typical deposition processes, such as plasma enhanced chemical vapor deposition. The thickness of dielectric layer 14 is preferably approximately 1000 to 7000 Angstroms in order to stop ions used in ion implantation processes in gallium arsenide.

A portion of dielectric layer 14 and dielectric layer 13 is then removed to define an active area 15, the area in semiconductor material 10 where the active portions of the semiconductor device are to be formed.

The method of removing dielectric layer 14 and dielectric layer 13 is an important feature of this invention. First, dielectric layer 14 is removed using a fluorine based plasma or reactive ion etch (RIE). Typical fluorine based plasmas include $C_2F_6$, $SF_6$, $NF_3$, $CF_4$, and $CHF_3$. A fluorocarbon based plasma is preferably used because of the controllability of slope of the sidewall.

It is important to note that the fluorine based plasma does not etch dielectric layer 13. This is important because the surface of semiconductor material 10 can be completely protected from the high power RIE used for etching of dielectric layer 14. In an actual device fabrication a certain degree of overetch is required to accommodate the etch rate non-uniformity across the wafer, day-to-day fluctuations of the etch rate and thickness variations of the as-deposited film to be etched. Because dielectric layer 13 is an infinite etch stop for fluorine based plasmas, it will buffer all process fluctuations occurring during deposition and etching of dielectric layer 14. Therefore, by using dielectric layer 13 the process becomes simpler and more manufacturable with large process latitude such as independence of the type of etch equipment, wafer diameter, and photolithographic mask density.

Dielectric layer 13 is then preferably removed using an ammonium hydroxide solution ($NH_4OH$). Most preferably, the solution is $NH_4OH:H_2O$ (1:10) and used at a temperature of approximately 20° to 40° C. Other wet chemistries may be suitable, however, dilute $NH_4OH$ is preferable because it has reproducible etch rate and is compatible with GaAs. It is important that dielectric layer 13 be removed before exposure to a high temperature (greater than approximately 500° C.) step, because it has been discovered that it then becomes impossible to fully remove (contrary to what has been published by others in the past).

When a dielectric layer comprised of aluminum is exposed to a fluorine based plasma, a small amount of an aluminum fluoride layer is formed on the surface of the dielectric layer comprised of aluminum, and when this aluminum fluoride layer is exposed to high temperature, a reaction takes place altering the chemistry of aluminum fluoride layer making it impossible to remove with any known etchants. The present invention avoids the exposure of any dielectric layer comprised of aluminum which must be removed to a high temperature before removal.

Figure 2:
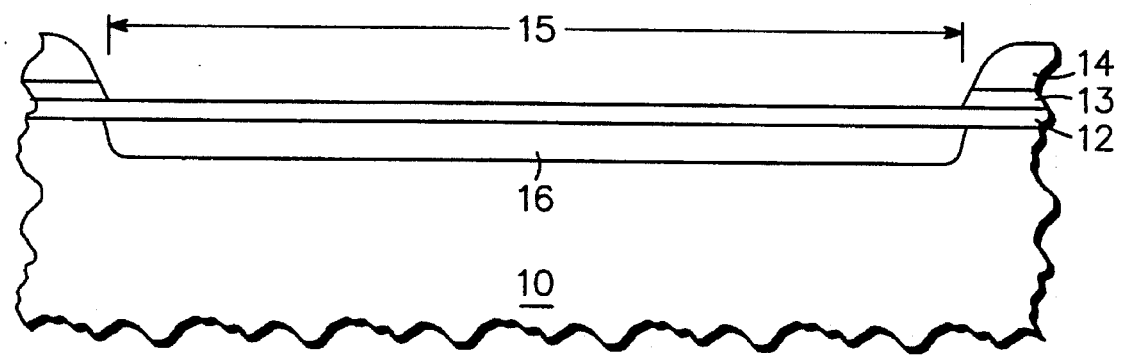
FIG. 2 illustrates an enlarged, cross-sectional view of the first embodiment of the present invention further along in processing.

FIG. 2 illustrates the structure of FIG. 1 further along in processing. A channel region 16 is formed in active area 15 of semiconductor material 10 using well known techniques. Typically, ion implantation of silicon impurities through silicon nitride layer 12 is performed.

Figure 3:
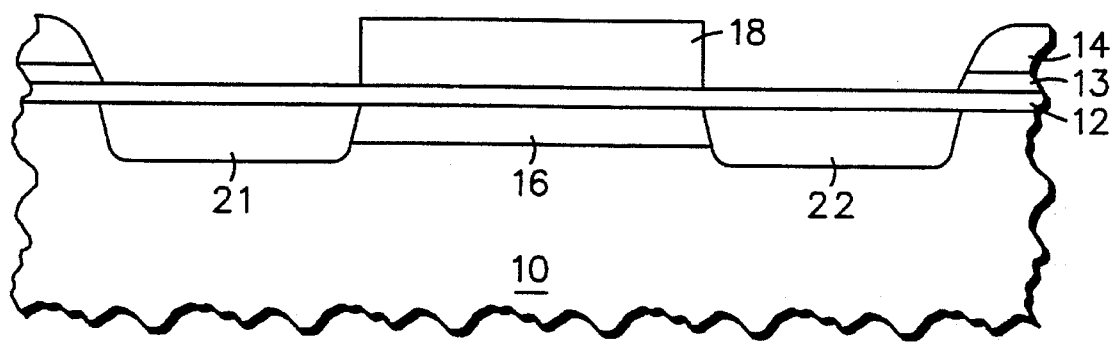
FIG. 3 illustrates an enlarged, cross-sectional view of the first embodiment of the present invention further along in processing.

FIG. 3 illustrates the structure of FIG. 2 further along in processing. A masking layer 18, preferably comprised of photoresist, is formed on a portion of channel region 16 using conventional photolithographic techniques. A source region 21 and a drain region 22 are then formed in active area 15 of semiconductor material 10, preferably by ion implantation to a doping level of about $5 \times 10^{17}$ to $10^{18}$ $cm^{-3}$ at an energy of 50 to 200 keV through silicon nitride layer 12. Source region 21 and drain region 22 are formed in a portion of channel region 16. Masking layer 18 is then removed. An anneal step is performed to remove the implant damage and to make the implanted impurities electrically active. Channel region 16, source region 21 and drain region 22 may be formed by other methods.

Figure 4:
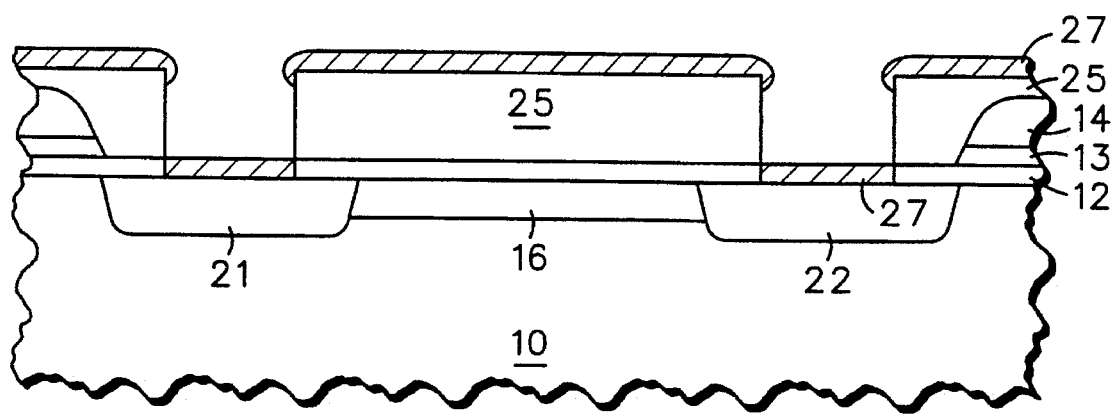
FIG. 4 illustrates an enlarged, cross-sectional view of the first embodiment of the present invention further along in processing.

FIG. 4 illustrates the structure of FIG. 3 further along in processing. Another masking layer 25 is formed over semiconductor material 10, leaving an opening to a portion of silicon nitride layer 12. The exposed portions of silicon nitride layer 12 are then removed using a low power plasma. The use of a low power plasma prevents damaging the surface of semiconductor material 10 as does the high power plasma process necessary to etch dielectric layer 14. The low power plasma utilizes $SF_6$, however, other suitable etchants may be used. A power of 100 to 200 watts is preferably used. It is important to use a low power plasma so that the surface of semiconductor material 10 in source region 21 and drain region 22 are not damaged. Any damage to the surface would leave or create high contact resistance.

An ohmic metal 27 is then deposited by evaporation or sputtering. Ohmic metal 27 which is deposited on the surface of III-V semiconductor material 10 over source region 21 and drain region 22 form electrical contacts to source region 21 and drain region 22. Ohmic metal 27 is comprised of a metal which can withstand subsequent processing temperatures and may be comprised of nickel and germanium and tungsten.

Figure 5:
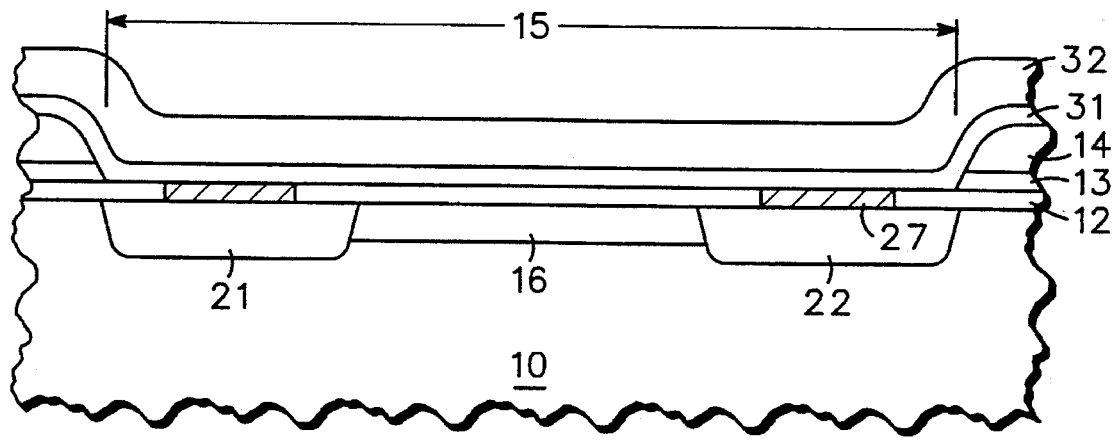
FIG. 5 illustrates an enlarged, cross-sectional view of the first embodiment of the present invention further along in processing.

FIG. 5 illustrates the structure of FIG. 4 further along in processing. Masking layer 25 and ohmic metal 27 formed on masking layer 25 are removed using well known lift-off techniques. An dielectric layer 31 comprised of aluminum is formed at least over active area 15. The formation of dielectric layer 31 is the same as dielectric layer 13. A dielectric layer 32 is formed over dielectric layer 31. Dielectric layer 32 is the same as dielectric layer 14.

Figure 6:
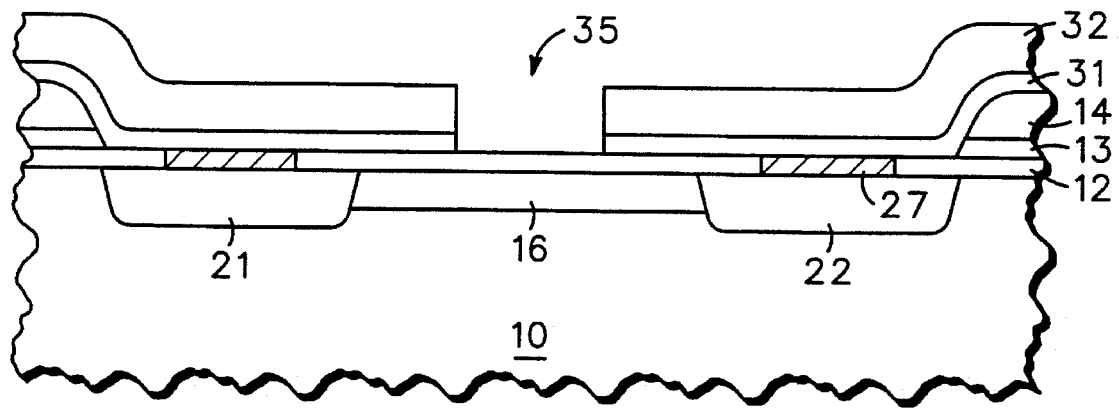
FIG. 6 illustrates an enlarged, cross-sectional view of the first embodiment of the present invention further along in processing.

FIG. 6 illustrates the structure of FIG. 5 further along in processing. A portion of dielectric layer 32 and a portion of dielectric layer 31 are removed to form an opening 35 to silicon nitride layer 12 over a portion of channel region 16. Thus an exposed portion of silicon nitride layer 12 is formed and opening 35 has sidewalls formed by dielectric layer 31 and dielectric layer 34. Dielectric layer 32 and dielectric layer 31 are removed using the same process used to remove dielectric layer 14 and dielectric layer 13 as disclosed above.

Figure 7:
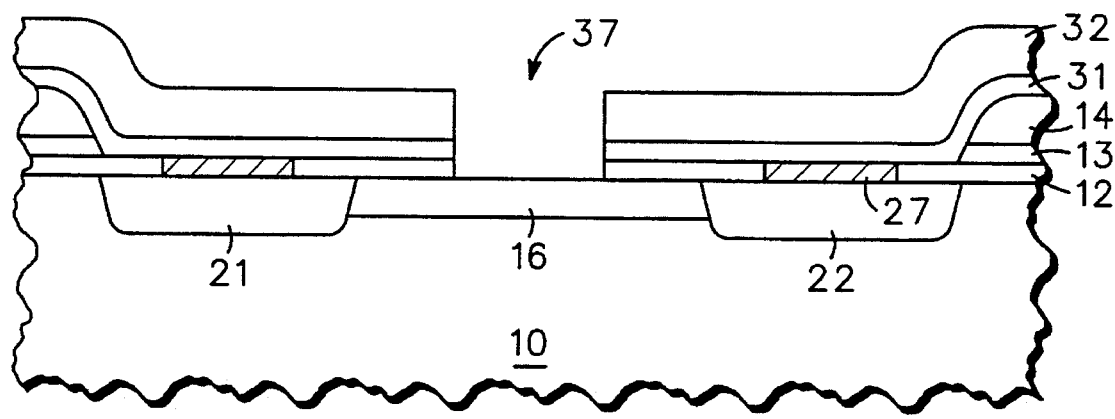
FIG. 7 illustrates an enlarged, cross-sectional view of the first embodiment of the present Invention further along in processing.

FIG. 7 illustrates the structure of FIG. 6 further along in processing. The exposed portion of silicon nitride layer 12 is removed using a low power fluorine based plasma to form an opening 37 to semiconductor material 10 over a portion of channel region 16 as described above to etch silicon nitride layer 12. It is important to use a low power plasma so that the surface of semiconductor material 10 in channel region 16 is not damaged. Any damage to the surface would leave or create electrically active defects resulting in deviations from the ideal diode characteristics such as high diode ideality factor and low Schottky barrier height.

Figure 8:
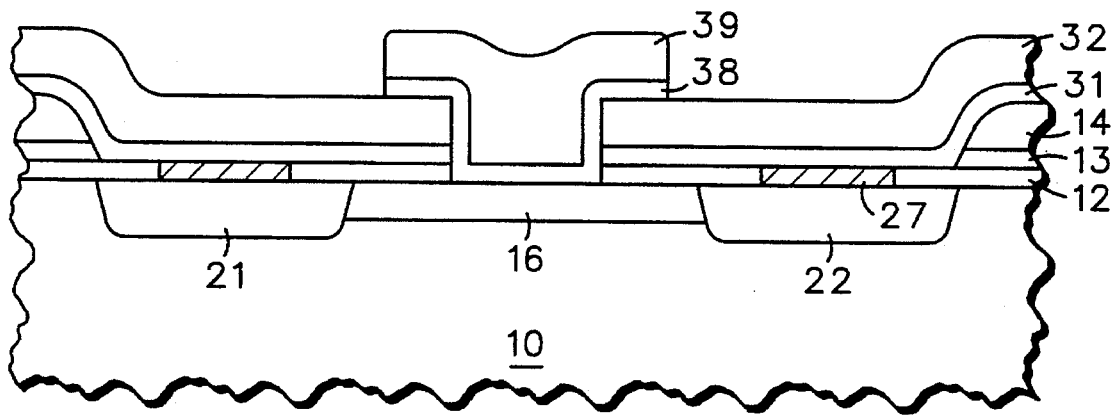
FIG. 8 illustrates an enlarged, cross-sectional view of the first embodiment of the present invention further along in processing.

FIG. 8 illustrates the structure of FIG. 7 further along in processing. A gate region is formed, and is preferably comprised of a barrier metal layer 38 and a overlying metal layer 39. Barrier metal layer 38 is preferably comprised of titanium tungsten nitride (TiWN), however, other barrier metals can be used. Overlying metal layer 39 is preferably comprised of aluminum, and formed at a high temperature so that it reflows to fill opening 37 in a planar fashion. Most preferably, overlying metal layer 39 is comprised of an alloy of aluminum and copper to obtain optimum reliability.

Figure 9:
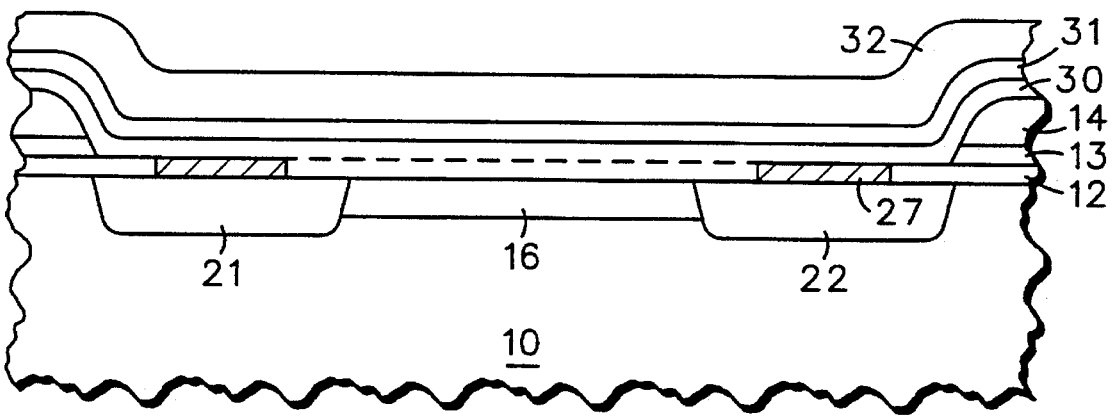
FIG. 9 illustrates an enlarged, cross-sectional view of a second embodiment of the present invention in an intermediate stage of fabrication.

FIG. 9 illustrates the structure of FIG. 4 further along in processing. FIG. 9 illustrates an optional process which may be used. A silicon nitride layer 30 may be formed at least over active area 15. Silicon nitride layer 30 is the same as silicon nitride layer 12. The interface between silicon nitride layer 12 and silicon nitride layer 30 is shown by a dotted line. The processes shown in FIGS. 5–8 are then carried out to form a structure similar to that shown in FIG. 8, except that a thicker dielectric layer (both silicon nitride layer 12 and silicon nitride layer 30) must be removed to form opening 37. Silicon nitride layer 30 is useful for forming capacitors comprised of ohmic and gate electrodes over semiconductor material 10. One skilled in the art would be able to fabricate capacitors as shown in FIG. 9, therefore, detailed steps will not be shown.

Figure 10:
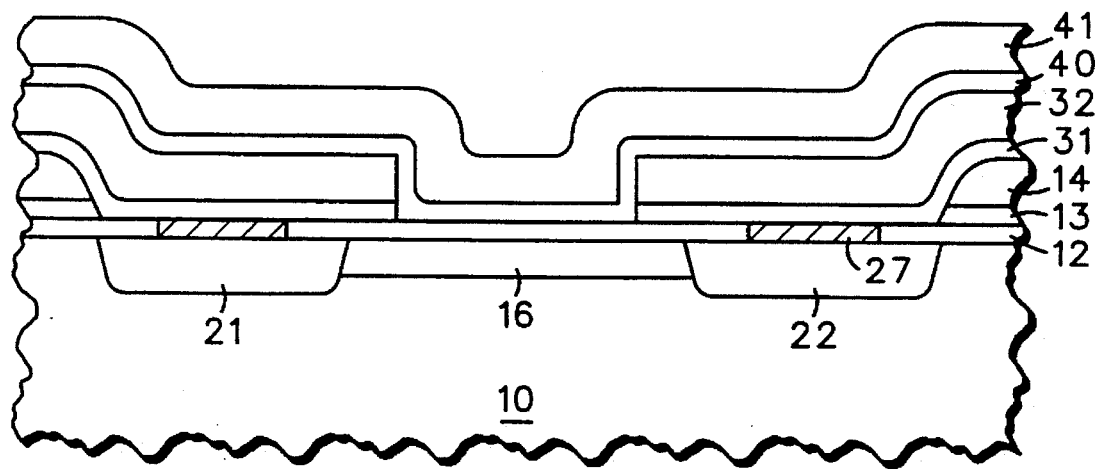
FIG. 10 illustrates an enlarged, cross-sectional view of a third embodiment of the present invention in an intermediate stage of fabrication.

FIG. 10 illustrates another embodiment of the present invention. FIG. 10 illustrates the structure of FIG. 6 further along in processing. A dielectric layer 40 comprised of aluminum is formed at least over active area 15 and in opening 35. A dielectric layer 41 comprised of silicon and oxygen is formed over dielectric layer 40.

Figure 11:
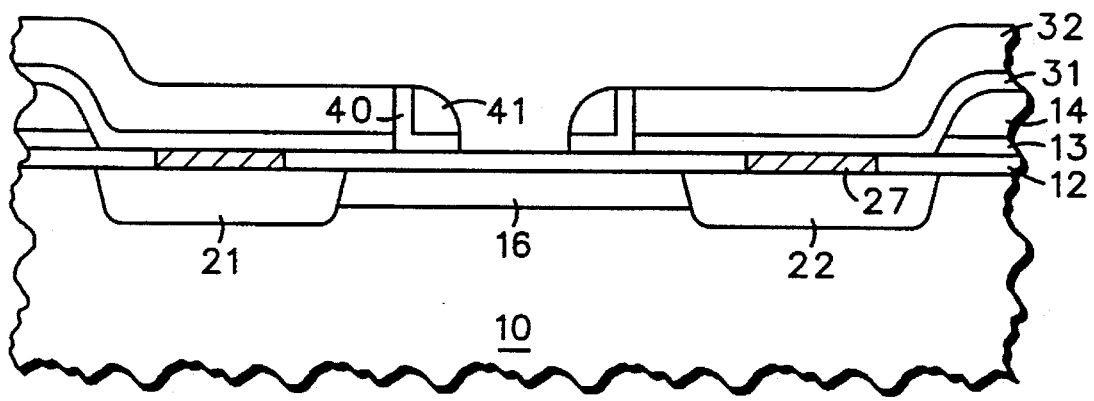
FIG. 11 illustrates an enlarged, cross-sectional view of the third embodiment of the present invention further along in processing.

FIG. 11 illustrates the structure of FIG. 10 further along in processing. A fluorine based reactive ion etch is then used to remove a portion of dielectric layer 41. Preferably, the same process is used as used to remove dielectric layer 14. Because the etch is anisotropic, a portion of dielectric layer 41 is left remaining as a spacer in opening 35 adjacent the sidewalls of dielectric layer 31 and dielectric layer 32. Dielectric layer 40 is then removed using the wet etch process described herein to remove dielectric layer 13. Dielectric layer 40 forms part of the spacer. The spacer acts to shrink opening 35 so that a smaller gate length may be fabricated. By using the techniques of this embodiment, a deep submicron gate length may be formed.

Figure 12:
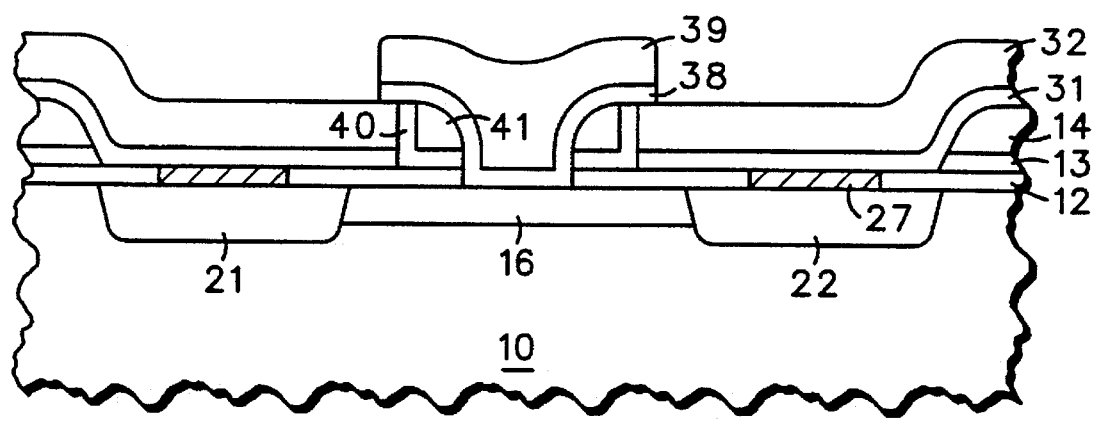
FIG. 12 illustrates an enlarged, cross-sectional view of the third embodiment of the present invention further along in processing.

FIG. 12 illustrates the structure of FIG. 11 further along in processing. A gate region is formed as has been shown and described with reference to FIG. 8.

A method for forming a gate region has been described. By using a dielectric layer stack comprised of silicon nitride, a dielectric layer comprised of aluminum and a dielectric layer comprised of silicon and oxygen in various steps in the active area of the semiconductor material, etching of the silicon nitride with a high power plasma is prevented. This prevents damaging the surface of the semiconductor material in the active area. Aluminum nitride is used as a sacrificial layer, in that it is always removed where necessary before a high temperature step is performed. Thus, aluminum nitride can be successfully used in semiconductor processing.

The benefits of this process are that submicron sized gates can be manufactured reproducibly using conventional optical lithographic techniques. The gate length can be controlled accurately by utilizing the anisotropic RIE etching of $SiO_2$, resulting in uniform threshold voltage of the field effect transistor. Also, the planar and highly conductive gate electrodes can be formed by using low resistive aluminum deposited at an elevated temperature, resulting in higher device performance.

I claim:

1. A semiconductor gate structure comprised of:
    a III-V semiconductor material having a channel region, a source region, and a drain region formed therein and having a first silicon nitride layer over the channel region;
    a first dielectric layer comprised of aluminum disposed over the first silicon nitride layer;
    a first silicon dioxide layer disposed over the first dielectric layer;
    an opening to the III-V semiconductor material in the first silicon dioxide layer, the first dielectric layer, and the first silicon nitride layer formed over a portion of the channel region, wherein the first silicon dioxide layer, the first dielectric layer and the first silicon nitride layer each have sidewalls after the opening is formed therein; and
    a gate layer disposed on the III-V semiconductor material in the opening to the semiconductor material and extending over a portion of the first silicon dioxide layer.

2. The gate structure of claim 1 wherein the gate layer is comprised of titanium tungsten nitride and aluminum copper.

3. The gate structure of claim 1 wherein the first silicon nitride layer is substantially free of moisture and hydrogen.

4. The gate structure of claim 1 wherein the first dielectric layer is comprised of aluminum nitride.

5. The gate structure of claim 1 further comprising:
    a second dielectric layer comprised of aluminum disposed on the sidewalls of the first silicon dioxide layer and on the sidewalls of the first dielectric layer and over the first silicon nitride layer in the opening; and
    a second silicon dioxide layer over the second dielectric layer, wherein the second dielectric layer and the second silicon dioxide layer form sidewall spacers adjacent the sidewalls of the first silicon dioxide layer and the first dielectric layer.

* * * * *